United States Patent
Grannen et al.

(10) Patent No.: US 6,526,909 B1
(45) Date of Patent: Mar. 4, 2003

(54) BIASED ION BEAM DEPOSITION OF HIGH DENSITY CARBON

(75) Inventors: Kevin John Grannen, Fremont, CA (US); Jeffrey Arthur McCann, Tracy, CA (US); Xiaoding Ma, Fremont, CA (US); Jing Gui, Fremont, CA (US); Mark Anthony Shows, Fremont, CA (US)

(73) Assignee: Seagate Technology, LLC, Scotts Valley, CA (US)

( * ) Notice: Subject to any disclaimer, the term of this patent is extended or adjusted under 35 U.S.C. 154(b) by 0 days.

(21) Appl. No.: 09/532,621

(22) Filed: Mar. 22, 2000

Related U.S. Application Data

(60) Provisional application No. 60/126,329, filed on Mar. 26, 1999.

(51) Int. Cl.$^7$ .................................................. H05H 1/00
(52) U.S. Cl. ........................... 118/723 FI; 118/723 R; 250/492.21; 250/425; 427/569; 427/577
(58) Field of Search .................. 118/723 FI, 723 R; 427/577, 569; 250/492.21, 425

(56) References Cited

U.S. PATENT DOCUMENTS

| | | | | |
|---|---|---|---|---|
| 5,888,593 A | * | 3/1999 | Petrmichl et al. | 427/563 |
| 6,203,862 B1 | * | 3/2001 | Bluck et al. | 427/569 |
| 6,375,810 B2 | * | 4/2002 | Hong | 204/192.12 |

* cited by examiner

Primary Examiner—Bruce Anderson
Assistant Examiner—Nikita Wells
(74) Attorney, Agent, or Firm—Victor Siber; Joseph Levi; Clifford Chance LLP

(57) ABSTRACT

A device for increasing the incident energy of an ion for coating a disc in an ion beam deposition process. The ion beam deposition process is performed in a chamber with the disc to be coated disposed therein. An ion source, having a voltage level, is introduced into the chamber for generating an ion beam for depositing ions on the disc. A bias contact is coupled to the disc and a power supply is coupled to the bias contact. The power supply applies a voltage level to the bias contact that is less than the voltage level of the ion source thereby creating a negative bias voltage between the disc and the ion source. This negative bias voltage causes the incident energy of the ion to increase. As a result, the optimal incident energy can be achieved using a lower original energy.

17 Claims, 4 Drawing Sheets

BIASED ION BEAM DEPOSITION OF HIGH DENSITY CARBON

This application claims the benefit of Provisional application Ser. No. 60/126,329, filed Mar. 26, 1999.

BACKGROUND

The following invention relates to magnetic discs and, in particular, a device for increasing the incident energy of ions during the ion beam deposition of a carbon overcoat for a magnetic disc substrate.

Magnetic discs are generally used for storing data in magnetizable form. Typically, one or more disks are rotated on a central axis in combination with data transducing heads positioned in close proximity to the recording surfaces of the disks and moved generally radially with respect thereto. Magnetic disks are usually housed in a magnetic disk unit in a stationary state with a magnetic head having a specific load elastically in contact with and pressed against the surface of the disk.

A typical magnetic disc is comprised of a substrate, typically an aluminum (Al)-base alloy, such as an aluminum-magnesium (Al—Mg) alloy, plated with a layer of amorphous nickel-phosphorous (NiP). Deposited on the substrate is a chromium (Cr) underlayer, a cobalt (Co)base alloy magnetic layer, a protective carbon overcoat 13 and a lubricant topcoat. The Cr underlayer, the Co-base alloy magnetic layer and the protective carbon overcoat 13 are typically deposited using sputtering techniques.

The process of depositing a carbon film on a magnetic disc traditionally involved sputtering a carbon target with a mixture of argon and hydrogen or other gases. Recently, an emerging technology called ion beam deposition has been used to deposit carbon film on a magnetic disc.

Referring now to FIG. 1, there is shown an Intevac MDP 250 deposition machine 1 used for ion beam deposition. Attached to deposition machine 1 is a process chamber 9. A turbomolecular pump 3 is disposed in process chamber 9. Inside deposition machine 1 is a carousel (not shown) that includes a disc pedestal on which a disc to be carbon coated is placed. An ion source 7, typically operating on a feed of hydrocarbon and argon gas, is introduced into process chamber 9.

In operation, the disc is positioned in process chamber 9. Ion source 7, which generates an ion beam consisting of positively charged ions of argon and hydrocarbon, is propelled towards the disc by repulsion from a positively charged anode. Concurrently, pump 3 pulls the gas towards the disc resulting in the disc being coated. The ion beam deposition process requires high gas flows (to ion source 7) and low pressures (created by turbomolecular pump 3) in order to establish an incident energy level (the energy of the ions upon arrival at the substrate surface) sufficient for manufacturing throughput. It has been found that an incident energy of approximately 75–100 eV/carbon atom is optimum for the synthesis of the hardest and most dense carbon films. (See J. Robertson, "Amorphous Carbon", Advances in Physics, Vol. 35, No. 4, 1986).

A drawback of the prior art ion beam deposition techniques is that because the incident energy is affected by the operating parameters of the gun as well as the pressure in the deposition chamber, it is often necessary to increase the energy of the ions leaving the ion source to achieve the optimum incident energy. Higher pressures increase the probability of energy exchange occurring between a neutral background gas species (non-ionized argon and hydrocarbon) and the energetic ions. This causes the ion becomes thermalized with a very low energy and the neutral gas acquires approximately the energy the ion had before the collision. Higher pressures also attenuate the energy of the ions as the ions collide with the neutral gas molecules. As a result, the incident energy of the ions is reduced which results in the density of the carbon layer to be reduced as well.

Referring now to FIG. 2, there is shown a chart showing the momentum loss of ions having an original energy of 100 eV, for three different pressures in chamber 9. For example, at 1.5 mTorr pressure, the ions leave ion source 7 with an energy of 60–100 eV. By the time the ions reach the substrate, their energy reduced to approximately 40–60 eV due to charge-exchange with neutral gas atoms and collisions and momentum loss caused by background gas molecules. Because the incident energy of the ions is greatly reduced by these factors, it is necessary to raise the original energy of the ions leaving the source to achieve optimum incident energy. Accordingly, it is desirable to provide an apparatus in which a lower original energy produces the optimum incident energy for carbon coating using disc ion beam deposition.

SUMMARY OF THE INVENTION

The present invention is directed to a device for increasing the incident energy of an ion for coating a disc in an ion beam deposition process. The ion beam deposition process is performed in a chamber with the disc to be coated disposed therein. An ion source, having a voltage level, is introduced into the chamber for generating an ion beam for depositing ions on the disc. The present invention includes a bias contact coupled to the disc and a power supply coupled to the bias contact. The power supply applies a voltage level to the bias contact that is less than the voltage level of the ion source thereby creating a negative bias voltage between the disc and the ion source. This negative bias voltage causes the incident energy of the ion to increase. As a result, the optimal incident energy can be achieved.

The invention accordingly comprises the features of construction, combination of elements and arrangement of parts which will be exemplified in the following detailed disclosure, and the scope of the invention will be indicated in the claims.

BRIEF DESCRIPTION OF THE DRAWINGS

For a fuller understanding of the invention, reference is had to the following description taken in conjunction with the accompanying drawings, in which.

DETAILED DESCRIPTION OF THE PREFERRED EMBODIMENTS

Figure 3:
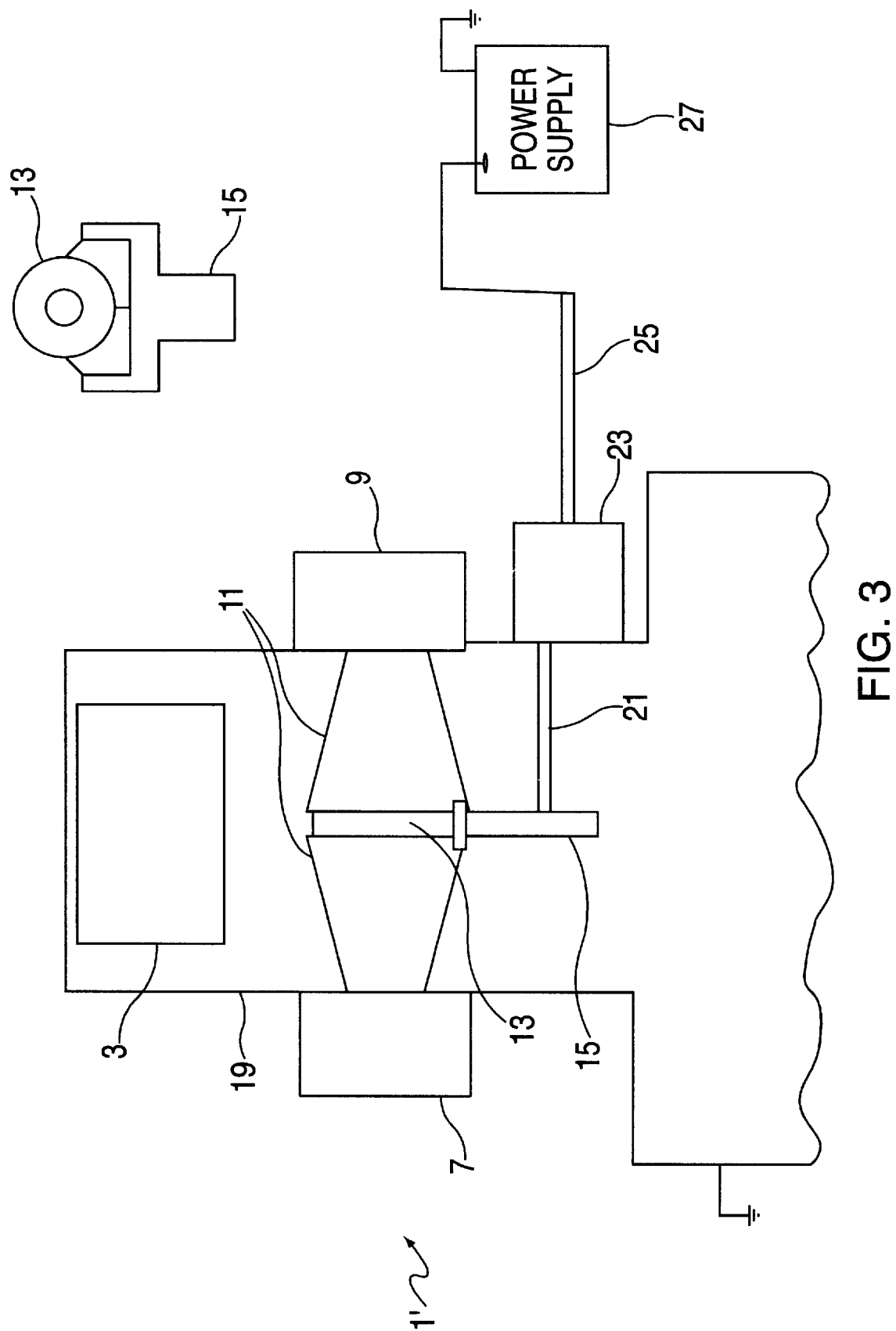
FIG. 3 is a front view of the ion beam deposition machine of the present invention.

Referring now to FIG. 3, there is shown an ion beam deposition machine 1' of the present invention. Deposition machine 1' includes a chamber 19 and a turbomolecular pump 3 disposed in chamber 19 for creating a negative pressure that is required for the ion beam deposition process according to techniques well know in the art. Disposed in chamber 19 is a pedestal 15, preferably made from stainless steel, that receives a disc 13 that is to be coated by deposition machine 1'. An ion source 7 is introduced into chamber 19 at a point adjacent to disc 13. Ion source 7 generates an ion beam 11 that deposits ions on disc 13. In an exemplary embodiment, disc 13 is seven inches from ion source 7.

A bias contact 21, preferably made from gold-coated stainless steel and having a first end and a second end, is electrically coupled to pedestal 15 at the first end of bias contact 21. The second end of bias contact 21 is fed through chamber 19 and electrically coupled to a high-voltage feed through 23. Bias contact 21 is coupled to high-voltage feed through 23 so that bias contact 21 can exit chamber 19 without breaking the vacuum in chamber 19. High-voltage feed through 23 is electrically coupled to a power supply wire 25 which in turn is electrically coupled to power supply 27. In an exemplary embodiment, power supply 27 outputs a voltage level in the range of 0 to −120 volts DC. Alternatively, power supply 27 may be an alternating current (AC) supply.

To increase the incident energy of the ions from ion beam 11, a negative voltage is applied to pedestal 15 via bias contact 21. Because disc 13 is coupled to pedestal 15, the negative voltage is also applied to disc 13. This causes disc 13 to be negatively biased with respect to ion source 7, which is typically at 80 volts. Because disc 13 is negatively biased with respect to ion source 7, the positively charged ions leaving ions source 7 impact disc 13 with an increased energy level due to the acceleration caused by the negative electric field applied to disc 13. As a result of this increased incident energy, the density of the carbon layer applied to disc 13 is increased.

Figure 1:
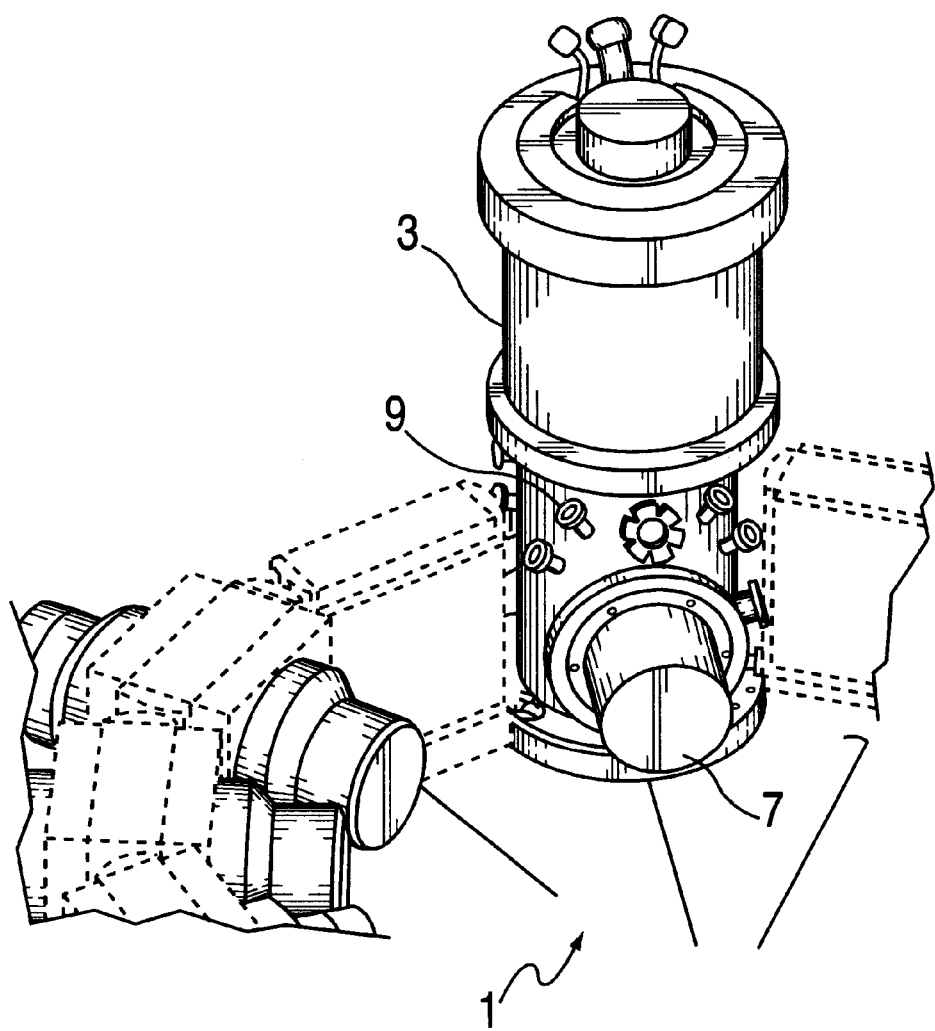
FIG. 1 is a prior art ion beam deposition machine.
Figure 2:
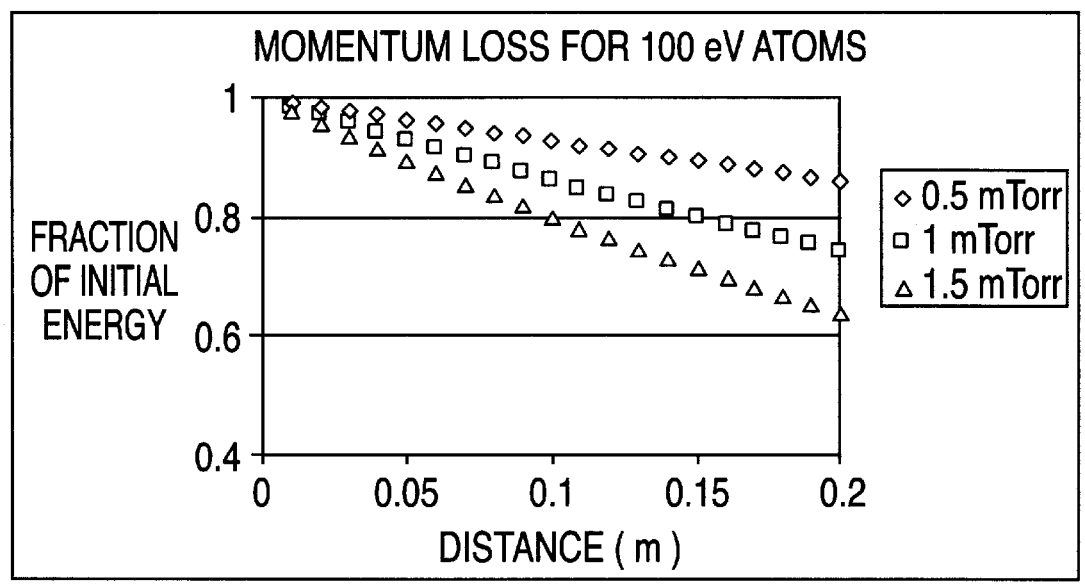
FIG. 2 is a chart showing the momentum loss of ions having an original energy of 100 eV.
Figure 4:
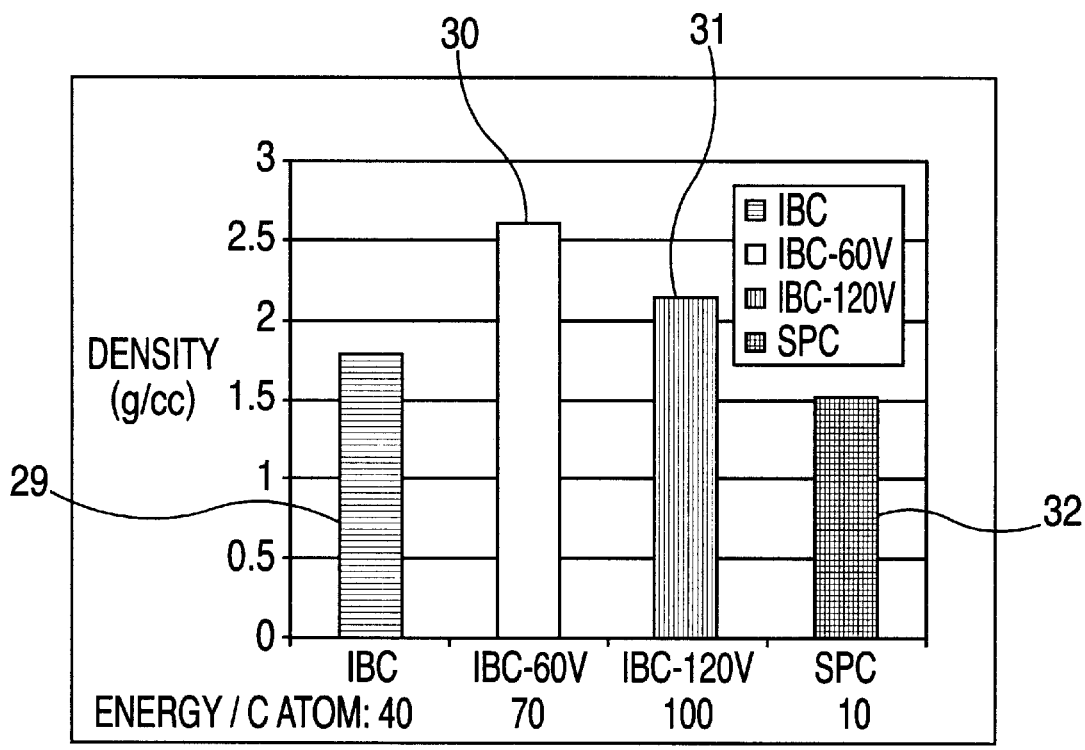
FIG. 4 is a chart showing the effect that applying a negative DC bias has on the resulting carbon density.

Referring now to FIG. 4, there is shown a chart showing the effect that applying a negative DC bias to disc 13 has on the resulting carbon density of disc 13. For example, bar 29 indicates that for ions having an original energy of 40 eV/C atom, the resulting carbon density of disc 13 will be 1.75 g/cc using the ion beam deposition (IBC) method. Bar 30 shows that for an ion having an original energy of 70 eV/C atom, the resulting carbon density will be slightly greater than 2.5 g/cc when a negative bias of 60 volts is applied. For an ion having an original energy of 100 eV/C atom, the resulting carbon density will be slightly greater than 2.0 g/cc when a negative bias of −100 volts is applied, as shown by bar 31. Finally, for comparison, bar 32 shows the resulting density when the sputtered carbon deposition method is used. In summary, the data in FIG. 2 demonstrates that the carbon density for ion beam deposited films varies with of the amount of negative bias applied to disc 13.

Accordingly, an ion beam deposition apparatus is provided in which the loss of incident energy of the coating ions is overcome by applying a negative DC bias to the disc to be coated. The applied negative bias causes the ions to accelerate towards the disc with an increase in the ion's energy thereby causing an increase in the density of the carbon coating. As the negative bias applied to the disc is increased, the incident energy of the ions increases which results in a increased carbon coating density.

It will thus be seen that the objects set forth above, among those made apparent from the preceding description, are efficiently attained and, because certain changes may be made in the construction set forth above without departing from the spirit and scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A device for increasing the incident energy of carbon-containing ions for coating a disc in an ion beam deposition chamber, said carbon-containing ions being generated by an ion source having a voltage level, said device comprising:

a bias contact having a first end and a second end, said first end of said bias contact being coupled to said disc; and a power supply coupled to said second end of said bias contact, said-power supply applying a voltage level to said bias contact thereby creating a negative bias voltage between said disc and said ion source of approximately 60 volts;

wherein when said carbon-containing ions have an original energy around 70 eV per carbon atom, said coating of said disc is an amorphous carbon film having a density of approximately 2.5 g/cc.

2. The device of claim 1, wherein said bias contact is gold-coated stainless steel.

3. The device of claim 1, further comprising a pedestal, wherein said disc is supported by said pedestal and said first end of said bias contact is coupled to said pedestal.

4. The device of claim 1, further comprising a high-voltage feed through, wherein said second end of said bias contact is coupled to said high-voltage feed through and said high voltage feed through is coupled to said power supply.

5. The device of claim 1, wherein said power supply outputs direct current.

6. The device of claim 5, wherein said power supply has an output voltage in the range of 0 to −120 volts.

7. The device of claim 1, wherein said power supply outputs alternating current.

8. The device of claim 1, wherein said voltage level of said ion source is 80 volts.

9. A method for increasing the incident energy of carbon-containing ions for coating a disc in an ion beam deposition chamber, said carbon-containing ions being generated by an ion source introduced into said chamber and having a voltage level, said chamber including a bias contact having a first end and a second end, said first end of said bias contact being coupled to said disc and said second end of said bias contact being coupled to a power supply, the method comprising the step of:

forming a negative bias voltage of approximately 60 volts between said disc and said ion source so that when said carbon-containing ions have an original energy around 70 eV per carbon atom, said coating of said disc is an amorphous carbon film of density approximately 2.5 g/cc.

10. The method of claim 9, wherein said bias contact is gold-coated stainless steel.

11. The method of claim 9, further comprising a pedestal, wherein said disc is supported by said pedestal and said first end of said bias contact is coupled to said pedestal.

12. The method of claim 9, further comprising a high-voltage feed through, wherein said second end of said bias contact is coupled to said high-voltage feed through and said high voltage feed through is coupled to said power supply.

13. The method of claim 9, wherein said power supply outputs direct current.

14. The method of claim 13, wherein said power supply has an output voltage in the range of 0 to −120 volts.

15. The method of claim 9, wherein said power supply outputs alternating current.

16. The method of claim 9, wherein said voltage level of said ion source is 80 volts.

17. A device for increasing the incident energy of carbon-containing ions for coating a disc in an ion beam deposition chamber, said carbon-containing ions being generated by an ion source having a voltage level, said device comprising:

a bias contact having a first end and a second end, said first end of said bias contact being coupled to said disc; and a power supply coupled to said second end of said bias contact, said power supply applying a voltage level to said bias contact thereby creating a negative bias voltage between said disc and said ion source of approximately 120 volts;

wherein when said carbon-containing ions have an original energy around 100 eV per carbon atom, said coating of said disc is an amorphous carbon film having a density of approximately 2.0 g/cc.

* * * * *